United States Patent
Cheng et al.

(10) Patent No.: US 9,450,079 B2
(45) Date of Patent: Sep. 20, 2016

(54) FINFET HAVING HIGHLY DOPED SOURCE AND DRAIN REGIONS

(71) Applicant: INTERNATIONAL BUSINESS MACHINES CORPORATION, Armonk, NY (US)

(72) Inventors: Kangguo Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 84 days.

(21) Appl. No.: 14/248,796

(22) Filed: Apr. 9, 2014

(65) Prior Publication Data

US 2015/0295087 A1 Oct. 15, 2015

(51) Int. Cl.
*H01L 21/76* (2006.01)
*H01L 29/66* (2006.01)
*H01L 29/78* (2006.01)
*H01L 21/02* (2006.01)
*H01L 29/10* (2006.01)

(52) U.S. Cl.
CPC ....... *H01L 29/6681* (2013.01); *H01L 21/0257* (2013.01); *H01L 29/66545* (2013.01); *H01L 29/785* (2013.01); *H01L 29/7851* (2013.01); *H01L 21/0262* (2013.01); *H01L 21/02532* (2013.01); *H01L 29/1054* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 5,407,852 A | 4/1995 | Ghio et al. | |
| 7,442,967 B2 | 10/2008 | Ko et al. | |
| 7,479,669 B2 | 1/2009 | Saxler | |
| 7,859,064 B1 | 12/2010 | Oh et al. | |
| 8,148,718 B2 | 4/2012 | Asbeck et al. | |
| 8,445,892 B2 | 5/2013 | Cohen et al. | |
| 8,525,170 B2 | 9/2013 | Yamazaki et al. | |
| 8,652,932 B2* | 2/2014 | Adam | H01L 29/66545 438/424 |
| 8,994,123 B2* | 3/2015 | Asenov | H01L 29/517 257/288 |
| 9,040,363 B2* | 5/2015 | Basker | H01L 29/6681 438/151 |
| 9,123,743 B2* | 9/2015 | Lin | H01L 29/66545 |
| 2005/0184345 A1 | 8/2005 | Lin et al. | |
| 2009/0072270 A1 | 3/2009 | Asbeck et al. | |
| 2014/0175554 A1* | 6/2014 | Loubet | H01L 21/823431 257/368 |

OTHER PUBLICATIONS

Office Action dated Dec. 15, 2015 issued in U.S. Appl. No. 14/884,238, pp. 1-10.

* cited by examiner

*Primary Examiner* — Zandra Smith
*Assistant Examiner* — Andre' C Stevenson
(74) *Attorney, Agent, or Firm* — Tutunjian & Bitetto, P.C.; Steven Meyers

(57) ABSTRACT

A method of forming a semiconductor device that includes forming an in-situ doped semiconductor material on a semiconductor substrate, and forming fin structures from the in-situ doped semiconductor material. A sacrificial channel portion of the fin structures may be removed, wherein a source region and a drain region portion of the fin structures of the in-situ doped semiconductor material remain. The sacrificial channel portion of the fin structure may then be replaced with a functional channel region.

10 Claims, 8 Drawing Sheets

FINFET HAVING HIGHLY DOPED SOURCE AND DRAIN REGIONS

BACKGROUND

1. Technical Field

The present disclosure relates to semiconductor devices, such as semiconductor devices including fin structures.

2. Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method is disclosed for forming a semiconductor device that includes forming fin structures from an in-situ doped semiconductor layer that is present on a semiconductor substrate, and forming a sacrificial gate structure on a sacrificial channel portion of the fin structures. Epitaxial merge structures may then be formed on the source and drain region portions of the fin structures. The sacrificial gate structure can then be removed to expose the sacrificial channel portion of the fin structures. The sacrificial channel portion of the fin structure may then be replaced with a functional channel region, and a functional gate structure may be formed on the functional channel region.

In another embodiment, the method of forming the semiconductor device may include forming an in-situ doped semiconductor material on a semiconductor substrate, and forming fin structures from the in-situ doped semiconductor material. A sacrificial channel portion of the fin structures may then be removed, wherein a source region and a drain region portion of the fin structures of the in-situ doped semiconductor material remain. The sacrificial channel portion of the fin structure may then be replaced with a functional channel region.

In another aspect, a semiconductor device is provided that includes a fin structure comprising a function channel region, a source region portion and a drain region portion. The source region and drain region portions of the fin structure are composed of a first epitaxial semiconductor material that is in-situ doped. The functional channel region of the fin structure is composed of a second epitaxial semiconductor material. A gate structure is present on the functional channel region of the fin structure. The semiconductor device may further include a composite spacer including a fin spacer providing the base of the composite spacer and a gate sidewall spacer overlying the fin spacer.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
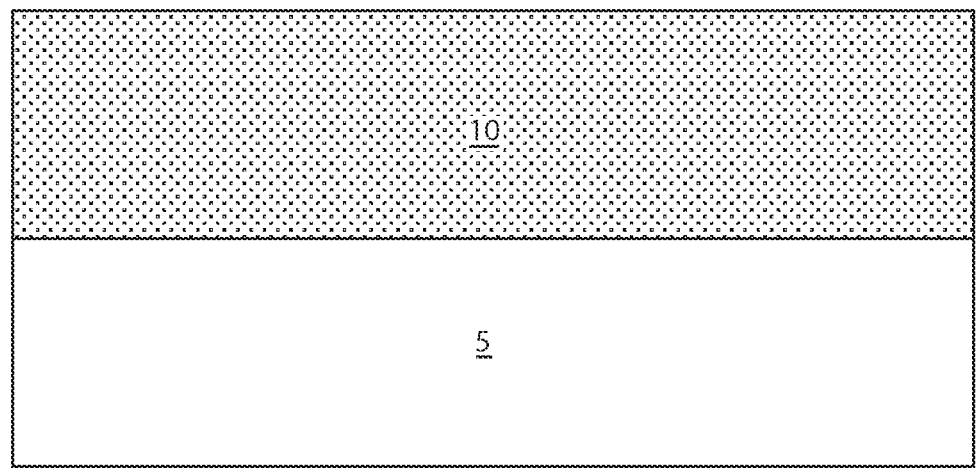
FIG. 1 is a side cross-sectional view depicting forming an in-situ doped semiconductor material on a semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A Fin Field Effect Transistor (FinFET) is a semiconductor device that positions the channel region of the semiconductor device in a fin structure.

In some embodiments, the methods and structures disclosed herein provide a FinFET semiconductor device that can be formed on a bulk semiconductor substrate, in which the source and drain region portions of the fin structure have a high dopant concentration of n-type or p-type dopants, a uniform dopant concentration of n-type or p-type dopants, as well as a abrupt junction with the channel region of the fin structure. In some embodiments, the high and uniform concentration of n-type or p-type dopants that is present in the source and drain regions results from the source and drain regions being formed using a process that employs in situ doping. By "in-situ" it is meant that the dopant that dictates the conductivity type, i.e., n-type or p-type, of the source and drain regions is introduced during the process step that forms the source and drain regions. For example, the dopant that dictates the conductivity type of the source and drain regions may be introduced during the epitaxial deposition process that forms the material layer for the source and drain regions, wherein as each layer of the material is deposited an substantially equal amount of dopant is introduced to each layer of the material being deposited so that the concentration of dopant in the deposited material is uniform throughout the deposited materials thickness. This is distinguishable from introducing the dopant that dictates the conductivity type of a material after it is formed using ion implantation. Dopant that is introduced by ion implantation typically has a high concentration region, which is the target depth for the dopant being implanted, with a tail of decreasing dopant extending from the high concentration region. Further, dopant introduced by ion implantation damages the lattice structure of the material being implanted, which introduces defects to the material being implanted. In some embodiments, the source and drain regions of the fin structures produced by the present method have a low defect density, which at least in part results from their formation using epitaxial deposition and in situ doping. In some embodiments, the methods and structures that are disclosed herein initially provide optimized source and drain region doping across the entire fin structure, and then provides a replacement channel region to provide the correct channel doping for the semiconductor device, e.g., FinFET. The methods and structures disclosed herein provide a fin structure including uniform doping of n-type or p-type dopants in the source and drain region portions of the fin structure, and a lower dopant concentration of n-type or p-type dopants in the source and drain region portions of the fin structure than the dopant concentration of n-type or p-type dopants in the epitaxial merge structures that are formed on the source and drain region portions of the fin structures. The methods and structures of the present disclosure are now discussed with more detail referring to FIGS. 1-9B.

FIG. 1 depicts one embodiment of forming an in situ doped semiconductor material 10 on a semiconductor substrate 5. In some embodiments, the semiconductor substrate 5 may be a bulk semiconductor substrate. The bulk semiconductor substrate may have a single crystal, i.e., monocrystalline, crystal structure. In some embodiments, the semiconductor substrate 5 is composed of a silicon including material. In some embodiments, the silicon including material that provides the semiconductor substrate 5 may include, but is not limited to silicon, single crystal silicon, multicrystalline silicon, polycrystalline silicon, amorphous silicon, strained silicon, silicon doped with carbon (Si:C), silicon alloys or any combination thereof. In other embodiments, the semiconductor substrate 5 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors.

The in situ doped semiconductor material 10 that is formed on the semiconductor substrate 5 is typically formed using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. An epitaxial material is a material that has been deposited using an epitaxial deposition process, and therefore has the characteristics of an epitaxially deposited material, such as having the substantially the same crystalline characteristics as the semiconductor material of the deposition surface. In some embodiments, when the chemical reactants are controlled and the system parameters set correctly, the depositing atoms of an epitaxial deposition process arrive at the deposition surface with sufficient energy to move around on the surface and orient themselves to the crystal arrangement of the atoms of the deposition surface. For example, an epitaxial film deposited on a {100}crystal surface will take on a {100}orientation.

The in situ doped semiconductor material 10 may be a type IV semiconductor material, such as a silicon including material, or may be a compound semiconductor, such as a type III-V semiconductor material. For example, when the in situ doped semiconductor material 10 is a type IV semiconductor material, the in situ doped semiconductor material 10 may be silicon, single crystal silicon, multicrystalline silicon, polycrystalline silicon, silicon doped with carbon (Si:C), germanium (Ge), silicon germanium (SiGe), silicon germanium doped with carbon (SiGe:C) and combinations thereof. When the in situ doped semiconductor material is a compound semiconductor, such as a type III-V semiconductor material, the compound semiconductor material may be selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. It is noted that the above examples of compositions for the epitaxial material that provide the in situ doped semiconductor material 10 are provided for illustrative purposes only, and are not intended to be limitation. Other material compositions may be equally suitable for use with the present disclosure.

A number of different sources may be used for the deposition of the semiconductor material that forms the in situ doped semiconductor material 10. In some embodiments, in which the semiconductor material that forms the in situ doped semiconductor material 10 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane ($(CH_3)SiH_3$), dimethylsilane ($(CH_3)_2SiH_2$), ethylsilane ($(CH_3CH_2)SiH_3$), methyldisilane ($(CH_3)Si_2H_5$), dimethyldisilane ($(CH_3)_2Si_2H_4$), hexamethyldisilane ($(CH_3)_6Si_2$) and combinations thereof. In some embodiments, in which the semiconductor material that forms the in situ doped semiconductor material 10 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the in situ doped semiconductor material 10 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. It is noted that the above examples of source gasses for deposition of epitaxial material are provided for illustrative purposes only, and are not intended to be limitation. Other deposition source gasses may be equally suitable for use with the present disclosure.

As indicated above, in some embodiments, the dopant that dictates the conductivity type, i.e., p-type or n-type dopant, for the in situ doped semiconductor material 10 is introduced to the epitaxially deposited material as it is being formed. In this manner, the concentration of the dopant that dictates the conductivity type, i.e., p-type or n-type dopant, for the in situ doped semiconductor material 10 is substantially the same, i.e., uniform, throughout the entire thickness of the in situ doped semiconductor material 10, and therefore may be referred to as a dopant concentration that is uniform. For example, the concentration of the dopant that dictates the conductivity type of the in situ doped semiconductor material 10 that is measured proximate to the interface with the semiconductor substrate 5 may be the same, e.g., within +/−10%, of the concentration of the dopant that dictates the conductivity type in the in situ doped semiconductor material 10 that is at the top of the in situ doped semiconductor material 10. The concentration of the n-type or p-type dopant at the midpoint for the thickness of the in situ doped semiconductor material 10 is typically the same, e.g., within +/−10%, as the concentration of n-type or p-type dopant at the upper and lower surfaces of the in situ doped semiconductor material 10.

An in situ doped semiconductor material 10 having a p-type conductivity may be produced in a type IV semiconductor, such as a silicon including semiconductor or a germanium including semiconductor, by doping the type IV semiconductor material with group III-A elements of the periodic table of elements, such as boron (B). An in situ doped semiconductor material 10 having an n-type conductivity may be produced in a type IV semiconductor, such as a silicon including semiconductor or a germanium including semiconductor, by doping the type IV semiconductor material with group V elements of the periodic table of elements, such as phosphorus (P) or arsenic (As). In some embodiments involving type IV semiconductor materials, the uniform concentration of n-type or p-type dopant that is present in the in situ doped semiconductor material 10 may range from $1 \times 10^{19}$ atoms/cm$^3$ to $2 \times 10^{21}$ atoms/cm$^3$. In another embodiment, the concentration of n-type or p-type dopant that is present in the in situ doped semiconductor material 10 may range from $1 \times 10^{19}$ atoms/cm$^3$ to $1 \times 10^{21}$ atoms/cm$^3$. In yet another embodiment, the concentration of n-type or p-type dopant that is present in the in situ doped semiconductor material 10 may range from $5 \times 10^{19}$ atoms/cm$^3$ to $2 \times 10^{20}$ atoms/cm$^3$.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines suitable for use with the present disclosure include trimethylphosphine ($(CH_3)_3P$), dimethylphosphine ($(CH_3)_2PH$), triethylphosphine ($(CH_3CH_2)_3P$) and diethylphosphine ($(CH_3CH_2)_2PH$). The p-type gas dopant source may include diborane ($B_2H_6$).

The thickness of the in situ doped semiconductor material 10 may range from 25 nm to 500 nm. In another embodiment, the thickness of the in situ doped semiconductor material 10 may range from 30 nm to 100 nm. In yet another embodiment, the thickness of the in situ doped semiconductor material may range from 30 nm to 60 nm.

In some embodiments, the in situ doped semiconductor material 10 may be annealed to activate the source and drain region portions of the subsequently formed fin structures. The annealing may be conducted using a furnace anneal, rapid thermal anneal (RTA) or laser anneal. In one embodiment, the temperature of activation anneal may range from 800° C. to 1200° C. In another embodiment, the anneal process may be at a temperature ranging from 900° C. to 1100° C. The time period for the annealing process may range from 10 milliseconds to 100 seconds. By conducting the activation anneal for the source and drain region portions of the fin structure at this stage of the process flow, the anneal process will not negatively impact the active device.

Although, an activation anneal may be employed, it is not necessary in the present process flow, as the activation anneal state can be omitted. In typical FinFET formation methods, a gate structure and gate sidewall spacer are formed on an undoped fin structure, and an doped source and drain epitaxial material is formed on the source and drain portions of the fin structure. The dopant from the doped source and drain epitaxial material is then diffused into the fin structure using a thermal anneal, in which some of the dopant diffuses under the gate sidewall spacer. This process is typically referred to as forming the extension or junction formation. The junction that is created using this prior method has a diffusion profile. More specifically, by diffusion profile it is meant that the extension or junction does not have a uniform dopant concentration. In an extension or junction that is formed using the aforementioned diffusion of dopant, the gradient typically goes from being of a high concentration adjacent to the source and drain portions of the fin structure that are not covered with the gate sidewall spacer, in which the dopant source originated, to a lower dopant concentration closer to the channel portion of the fin structure. In FinFET devices, the gate sidewall spacer is typically only 6 nm thick, so forming the junction within that limited dimension can be challenging.

As will be discussed in further detail below, by forming an in situ doped fin structure from the in situ doped semiconductor material 10, forming the gate sidewall spacer over the in situ doped fin structure, and then replacing the channel portion of the in situ doped fin structure with an intrinsic, i.e., undoped, semiconductor material, the method and structures that are disclosed herein provide a very abrupt junction. By "abrupt junction", it is meant that the transition from a high concentration of doped semiconductor material in the source and drain regions of the device to an undoped semiconductor material in the channel region of the device is within 1 nm to 2 nm. For example, the methods and structures disclosed herein provide a very abrupt junction with doped material touching undoped material, and no diffusion tail. Further, as will be described in greater detail below, the epitaxial deposition process for forming the epitaxial merge structures 25 is done at temperatures ranging from 500° C. to 700° C., for a time period on the order of be 1 minute, so there will be no diffusion of the n-type or p-type dopant into the channel region of the fin structure. Further, by eliminating the requirement for diffusion or activation annealing after epitaxial deposition steps for forming epitaxial merge structures 25, the methods disclosed herein may avoid, or at least substantially reduces, dislocation movement from epitaxial merge structure 25 regions into fin structure 10'.

Figure 2:
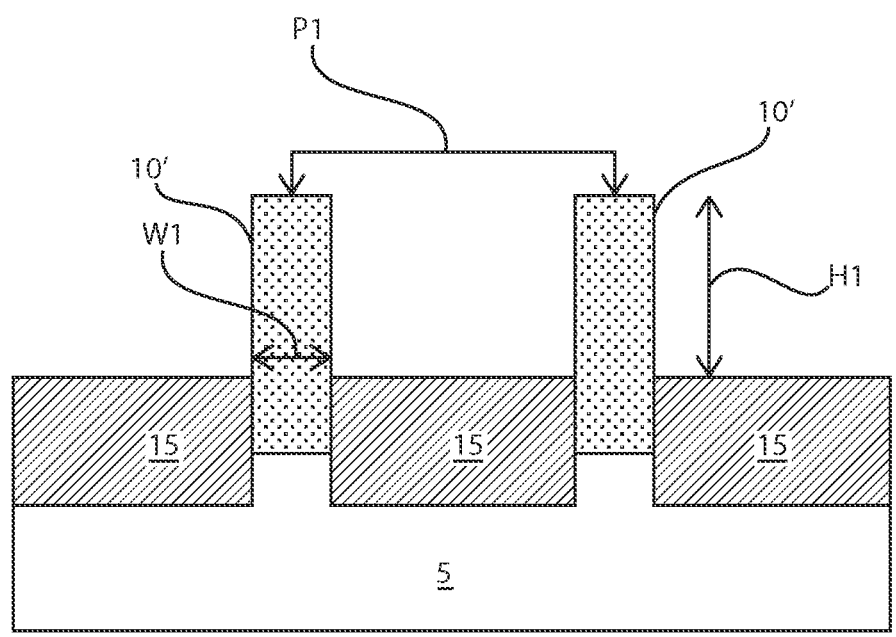
FIG. 2 is a side cross-sectional view depicting forming fin structures from the in-situ doped semiconductor material, in accordance with one embodiment of the present disclosure.

FIG. 2 depicts one embodiment of forming fin structures 10' from the in-situ doped semiconductor material 10. The fin structures 10' may be formed using etch processing. For example, the fin structures 10' may be formed using sidewall image transfer (SIT) methods. More specifically, in one example of a SIT method, a photoresist mandrel is first formed on a surface of the in situ doped semiconductor material 10. The photoresist mandrel may be formed using deposition, patterning and development processes. Thereafter, a low-pressure chemical vapor (isotropic) deposition provides a dielectric profile on the sidewalls of the photoresist mandrel. The photoresist mandrel may then be removed. For example, photoresist mandrel can be removed using a chemical strip or selective etching. Following removal of the photoresist mandrel, the dielectric profile remains to provide an etch mask. The in situ doped semiconductor material 10 is then etched using the dielectric profile as an etch mask to provide the fin structures 10'. The etch process for forming the fin structure 10' may be an anisotropic etch, such as reactive ion etching (RIE). The etch process may be continued until an entire thickness of the in situ doped semiconductor material 10 is removed. In some examples, a portion of the semiconductor substrate 5 that is underlying the etched portion of the in situ doped semiconductor material 10 is also recessed.

Following the formation of the fin structures 10', an isolation region 15 may be formed between the adjacent fin structures 10' in the plurality of fin structures. The isolation region 15 may be composed of a dielectric material, such as an oxide, nitride, or oxynitride material. For example, when the dielectric material of the isolation region 15 is in oxide, the isolation region 15 may be composed of silicon oxide ($SiO_2$). The isolation regions 15 may be formed by depositing the dielectric material in the trenches that are formed by etching the in situ doped semiconductor material 10 to form the fin structures 10'. In some embodiments, the dielectric material for the isolation regions 15 is deposited using chemical vapor deposition, and then etched back to recess the isolation regions 15 in order to adjust the height $H_1$ for the fin structures 10'. In some embodiments, the etch process for recessing the isolation regions 15 may also remove the dielectric mask that results from the sidewall image transfer (SIT) process that is used to form the fin structures 10'.

Referring to FIG. 2, each of the fin structures 10' may have a height $H_1$ ranging from 25 nm to 500 nm. In another embodiment, each of the plurality of fin structures 10' has a height $H_1$ ranging from 30 nm to 100 nm. In one example, each of the plurality of fin structures 10' has a height $H_1$ ranging from 30 nm to 60 nm. Each of the plurality of fin structures 10' may have a width $W_1$ of less than 20 nm. In another embodiment, each of the plurality of fin structures 5 has a width $W_1$ ranging from 3 nm to 8 nm. Although two fin structures 10' are depicted in FIG. 2, the present disclosure is not limited to only this example. It is noted that any number of fin structures may be present in the plurality of fin structures 10'. The pitch P1 separating adjacent fin structures 10' may range from 10 nm to 500 nm. In another example, the pitch P1 separating adjacent fin structures 10' may range from 20 nm to 50 nm.

In one example, when the semiconductor device being formed is a p-type field effect transistor (PFET), the fin structures 10' are composed of silicon germanium doped with boron. In another example, when the semiconductor device being formed is an n-type field effect transistor (NFET), the fin structures 10' are composed of silicon doped with phosphorus or arsenic. In one embodiment, both PFET and NFET semiconductor devices may be formed to be simultaneously present on the same semiconductor substrate 5.

Figure 3:
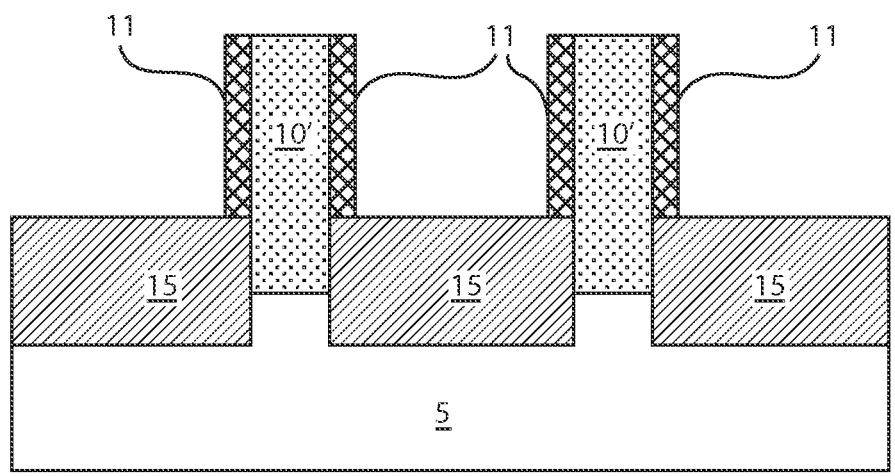
FIG. 3 is a side cross-sectional view depicting forming a dielectric spacer on the sidewall of the fin structures, in accordance with one embodiment of the present disclosure.

FIG. 3 depicts forming a dielectric spacer 11 on the sidewall of the fin structures 10'. The dielectric spacer 11 may be formed around the fin structures 10'. In one embodiment, the dielectric spacer 11 may be formed by using a blanket layer deposition, such as chemical vapor deposition (CVD), and an anisotropic etchback method. The dielectric spacer 11 may have a width ranging from 2.0 nm to 15.0 nm, and may be composed of a dielectric, such as a nitride, oxide, oxynitride, or a combination thereof. In one example, the dielectric spacer 11 is composed of silicon oxide ($SiO_2$).

Figure 4A:
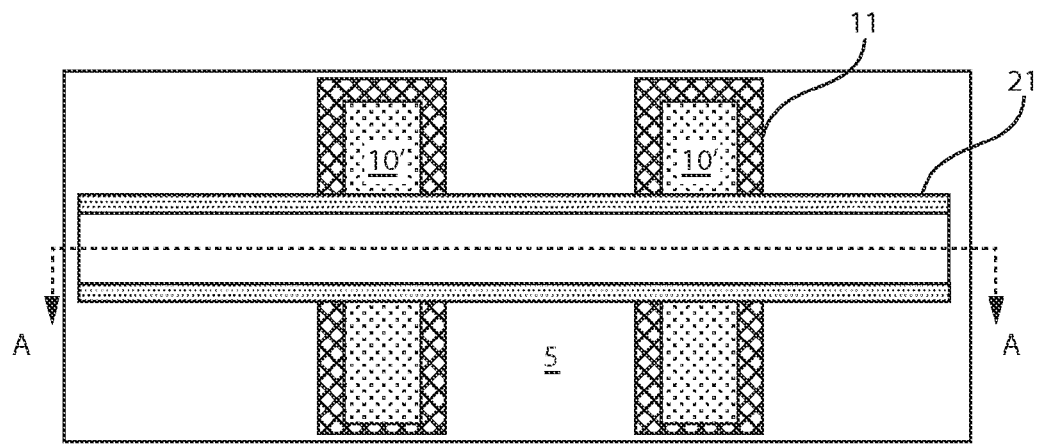
FIG. 4A is a top down view depicting forming a sacrificial gate structure on a sacrificial channel portion of the fin structures, in accordance with one embodiment of the present disclosure.
Figure 4B:
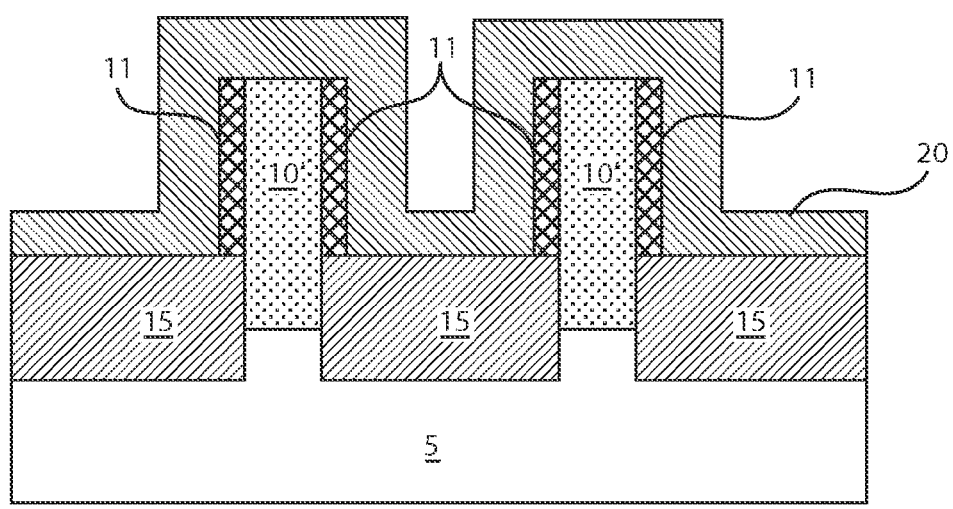
FIG. 4B is a side cross-sectional view along section line A-A in FIG. 4A.

FIGS. 4A and 4B depict forming a sacrificial gate structure 20 on a sacrificial channel portion of the fin structures 10'. By "sacrificial" it is meant that the structure is present during processing of the semiconductor device, but is removed from the semiconductor device prior to the device being completed. In the present process flow, a sacrificial gate structure 20 is employed as part of a replacement gate process. As used herein, the term "sacrificial gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the sacrificial gate structure 20 may be composed of any material that can be etched selectively to the fin structures 10'. In one embodiment, the sacrificial gate structure 20 may be composed of a silicon-including material, such as polysilicon. In another embodiment, the sacrificial gate structure 20 may be composed of a dielectric material, such as an oxide, nitride or oxynitride material, or amorphous carbon. The sacrificial gate structure 20 may be formed using deposition (e.g., chemical vapor deposition) photolithography and etch processes (e.g., reactive ion etching) to provide the sacrificial gate structure 20.

FIG. 4A also depicts forming a gate sidewall spacer 21 on the sidewall of the sacrificial gate structure 20. A portion of the gate sidewall spacer 21 encapsulates the dielectric spacer 11 that is present on the sidewall of the fin structure 10'. In some embodiments, the gate sidewall spacer 21 wraps around the dielectric spacer 11. The gate sidewall spacer 21 is typically composed of a dielectric material, such as an oxide, nitride, or oxynitride material. For example, when the gate sidewall spacer 21 is composed of an oxide, the gate sidewall spacer 21 may be composed of silicon oxide ($SiO_2$). In another example, when the gate sidewall spacer 21 is composed of a nitride, the gate sidewall spacer 21 may be composed of silicon nitride. In some examples, the gate sidewall spacer 21 is composed of a different material than the dielectric spacer 11 that is formed on the sidewall of the fin structure 10'. For example, the dielectric spacer 11 may be composed of a nitride or oxynitride material, while the gate sidewall spacer 21 is composed of low-k dielectric or a nitride. In some examples, the low-k dielectric of the gate sidewall spacer may have a dielectric constant of 4.0 or less (measured at room temperature, e.g., 25° C., and 1 atm). For example, a low-k dielectric material suitable for the gate sidewall spacer 21 may have a dielectric constant ranging from about 1.0 to about 3.0. Examples of low-k materials suitable for the gate sidewall spacer 21 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. In some embodiments, the gate sidewall spacer 21 is formed to separate the later formed epitaxial merge structures 25 from the gate conductor 40 of the later formed functional gate structure 45. The gate sidewall spacer 21 may be formed using a deposition process, such as chemical vapor deposition (CVD), and an anisotropic etchback method.

Figure 5A:
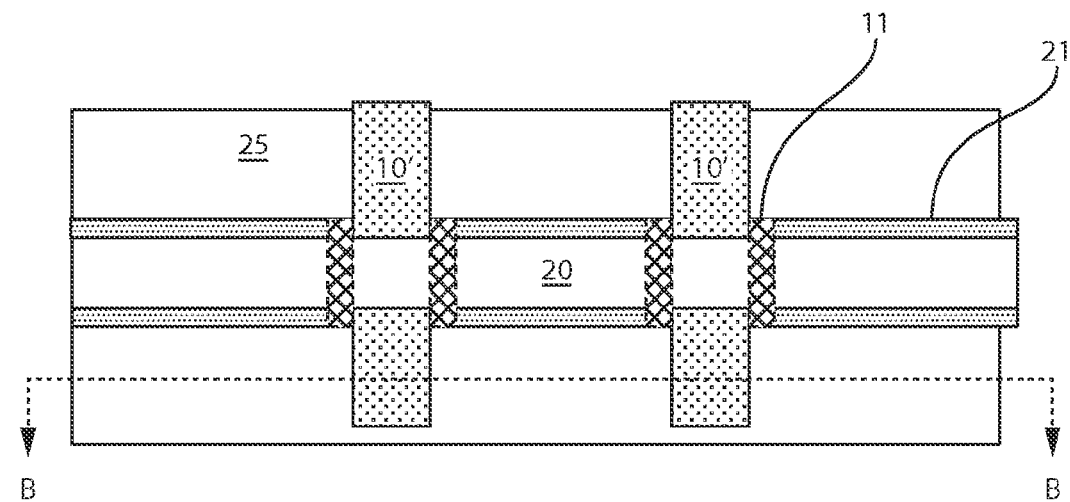
FIG. 5A is a top down view depicting forming epitaxial merge structures on the source and drain region portions of the fin structures, in accordance with one embodiment of the present disclosure.
Figure 5B:
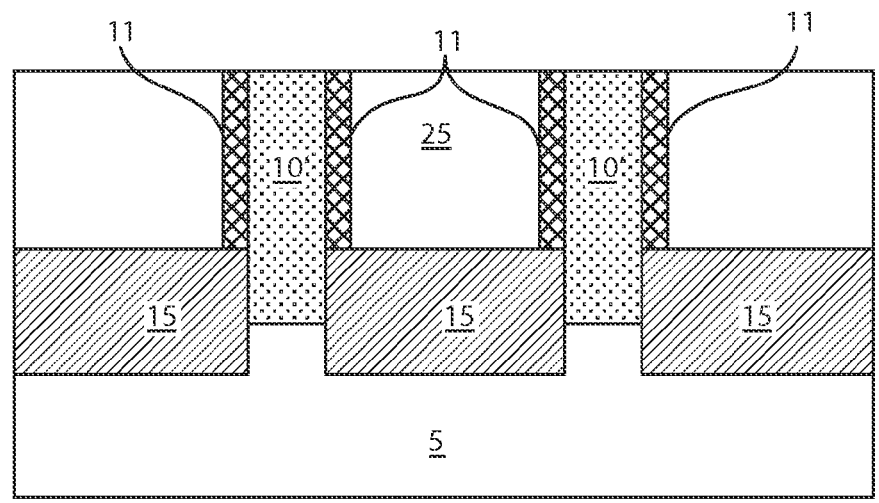
FIG. 5B is a side cross-sectional view along section line B-B in FIG. 5A.

FIGS. 5A and 5B depict forming epitaxial merge structures 25 on the source and drain region portions of the fin structures 10'. In some embodiments, the exposed portions of the dielectric spacer 11 that are present on the sidewall of the source and drain region portions of the fin structures 10' are removed prior to forming the epitaxial merge structures 25. The portion of the dielectric spacer 11 that is present on the sidewall of the sacrificial channel portion of the fin structures 10' is protected by the overlying sacrificial gate structure 20, as well as the overlying gate sidewall spacer 21. In some embodiments, the exposed portions of the dielectric spacer 11 are removed by an etch that is selective to the fin structure 10', the sacrificial gate structure 20, and the gate sidewall spacer 21. In FIG. 5A, the remaining portion of the dielectric spacer 11 is depicted using a broken line to indicate that the remaining portion of the dielectric spacer 11 is present under the sacrificial gate structure 20 and the gate sidewall spacer 21. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The etch process for removing the exposed portions of the dielectric spacer 11 may be an anisotropic etch or an isotropic etch. In some examples, the etch process may be a wet chemical etch, reactive ion etch (RIE), plasma etch, laser etch and combinations thereof.

Still referring to FIGS. 5A and 5B, the epitaxial merge structures 25 may extending between adjacent fin structures 10' in direct contact with two adjacent fins structures 10'. In some embodiments, the epitaxial merge structures 25 are formed on the exposed sidewall of at least one of a source region portion and a drain region portion of the fin structures 10', and optionally along an upper surface of the source region portion and the drain region portions of the fin structures 10'. The epitaxial merge structures 25 are only required for contact and not for active device performance. The epitaxial merge structures 25 may be composed of the same base material as the source and drain region portions of the fin structure 10'. Therefore, the above description of the type IV semiconductor materials, such as silicon including and germanium including semiconductor materials, and the above description of the compound semiconductor materials, such as type III-V semiconductor materials, that has been provided for the in situ doped semiconductor material 10 that provides the fin structures 10' is suitable for the description of the material of the epitaxial merge structures 25. In other embodiments, the material of the epitaxial merge structures 25 may be different from the material of the fin structures 10'. In this embodiment, the epitaxial merge structures 25 can be composed of type IV semiconductor materials, and compound semiconductor materials, such as type III-V semiconductor materials.

The epitaxial merge structures 25 may be doped with n-type or p-type dopants. Typically, the conductivity type of the epitaxial merge structures 25 is the same as the conductivity type of the source and drain region portions of the fin structures 10' that the epitaxial merge structures 25 are in contact with. For example, when the source and drain region portions of the fin structures 10' have an n-type conductivity, the epitaxial merge structures 25 have an n-type conductivity. The dopant concentration for the n-type or p-type dopant that is present in the epitaxial merge structures is typically greater than the dopant concentration of the n-type or p-type dopant in the source and drain region portions of the fin structure 10', but embodiments have been contemplated in which the dopant concentration of the p-type or n-type dopant that is present in the epitaxial merge structures 25 is equal to or less than the concentration of the p-type or n-type dopant in the source and drain region portions of the fin structures 10'. For example, the doping concentration in the epitaxial merge structures 25 can range from $1 \times 10$ atoms/ cm³ to 1.5×10²¹ atoms/cm³. In another example, the doping concentration in the epitaxial merge structures 25 can range from 4×10²⁰ atoms/cm³ to 8×10²⁰ atoms/cm³.

The epitaxial merge structures 25 may be formed using epitaxial deposition and in situ doping methods that are similar to the methods for forming the in situ doped semiconductor material 10 that is described above with reference to FIG. 1. Therefore, the description of epitaxial deposition and in situ doping for forming the in situ doped semiconductor material 10 that is described above with reference to FIG. 1 is suitable for the description of the epitaxial merge structures 25 that are depicted in FIGS. 5A and 5B.

Figure 6A:
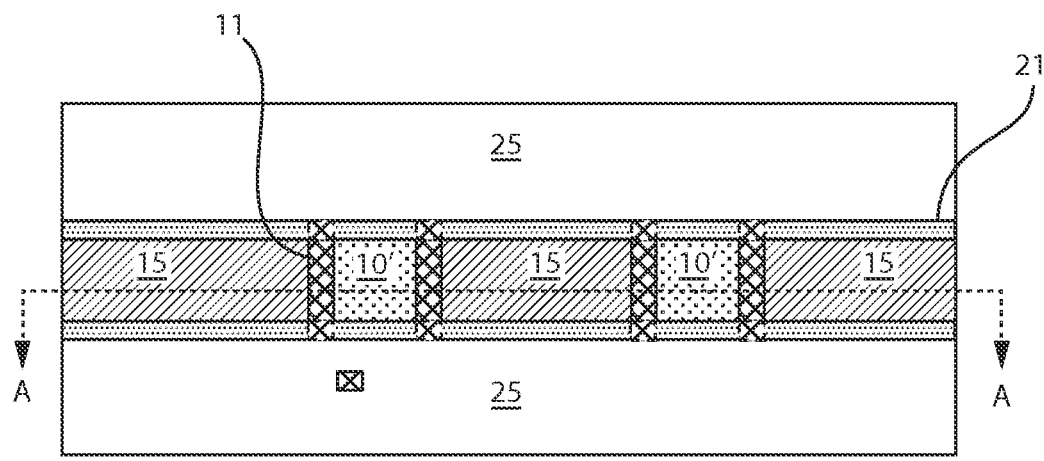
FIG. 6A is a top down view depicting removing the sacrificial gate structure on the sacrificial channel portion of the fin structures, in accordance with one embodiment of the present disclosure.
Figure 6B:
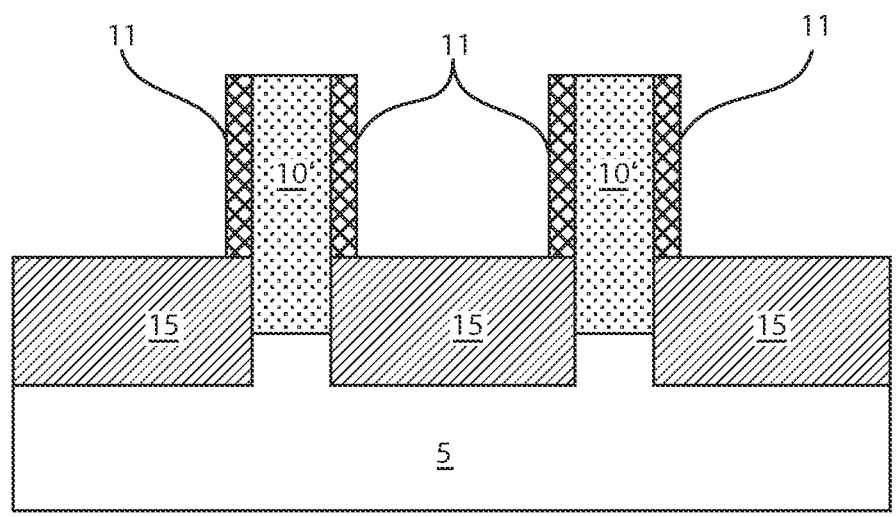
FIG. 6B is a side cross-sectional view along section line A-A in FIG. 6A.

FIGS. 6A and 6B depict one embodiment of removing the sacrificial gate structure 20 that is present on the sacrificial channel portion of the fin structures 10'. Removing the sacrificial gate structure 20 exposes the sacrificial channel portion of the fin structures 10'. In some embodiments, the sacrificial gate structure 20 may be removed by a selective etch process. The sacrificial gate structure 20 may be removed using a wet or dry etch process. In one embodiment, the sacrificial gate structure 20 is removed by reactive ion etch (RIE). In one example, the etch process for removing the sacrificial gate structure 20 can include an etch chemistry for removing the sacrificial gate structure 20 selective to fin structures 10 and the epitaxial merge structures 25.

Figure 7A:
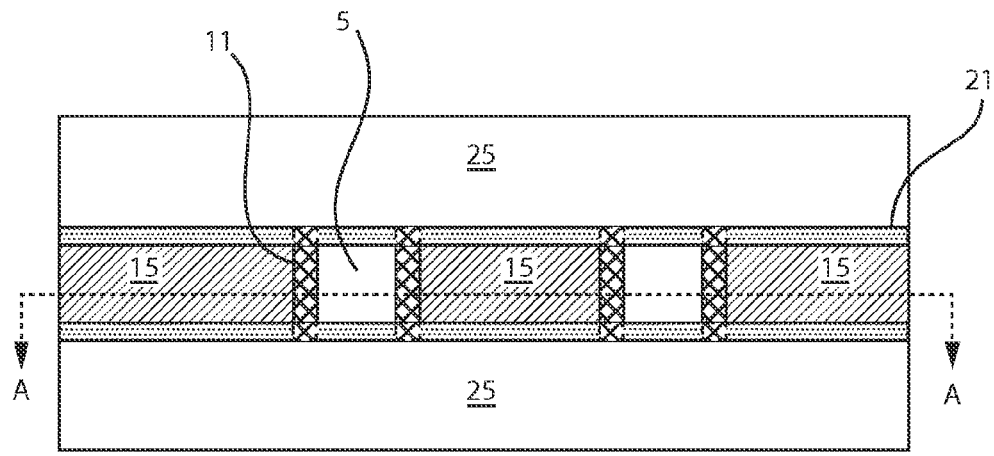
FIG. 7A is a top down view depicting removing the sacrificial channel portion of the fin structure, in accordance with one embodiment of the present disclosure.
Figure 7B:
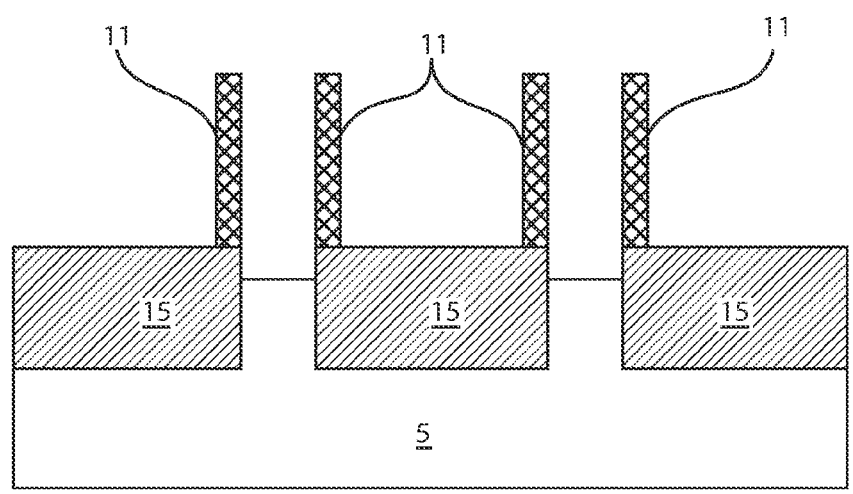
FIG. 7B is a side cross-sectional view along section line A-A in FIG. 7A.

FIGS. 7A and 7B depict one embodiment of removing the sacrificial channel portion of the fin structure 10'. Removing the sacrificial channel portion of the fin structure 10' exposes the underlying surface of the semiconductor substrate 5. In some embodiments, the sacrificial channel portion of the fin structure 10' may be removed by a selective etch process. The sacrificial channel portion of the fin structure 10' may be removed using a wet or dry etch process. In one embodiment, the sacrificial portion of the fin structure 10' is removed by reactive ion etch (RIE). In one example, the etch process for removing the sacrificial channel portion of the fin structure 10' can include an etch chemistry for removing the sacrificial channel portion of the fin structure 10' selectively to the exposed portion of the semiconductor substrate, the isolation regions 15, the exposed remaining portion of the dielectric spacer 11 and the epitaxial merge structures 25.

Figure 8A:
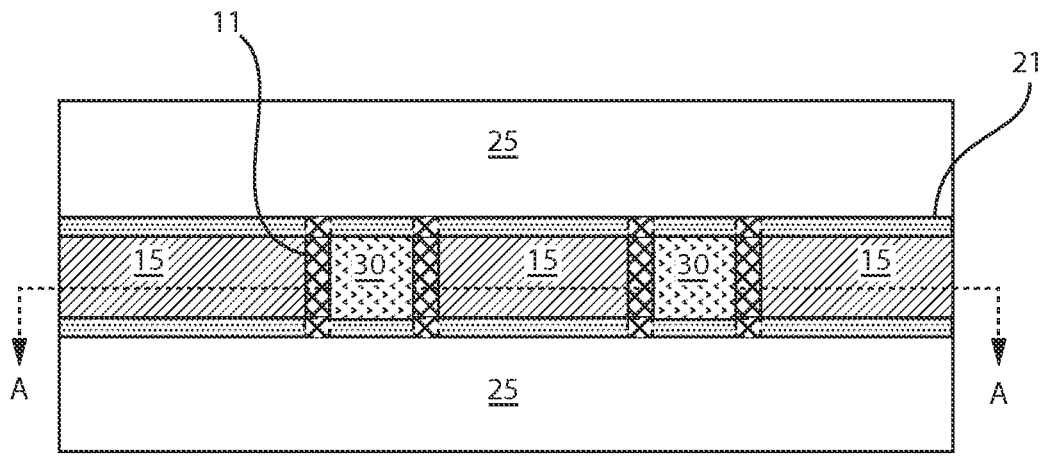
FIG. 8A is a top down view depicting one embodiment of epitaxially forming a functional channel region on an exposed surface of the semiconductor substrate.
Figure 8B:
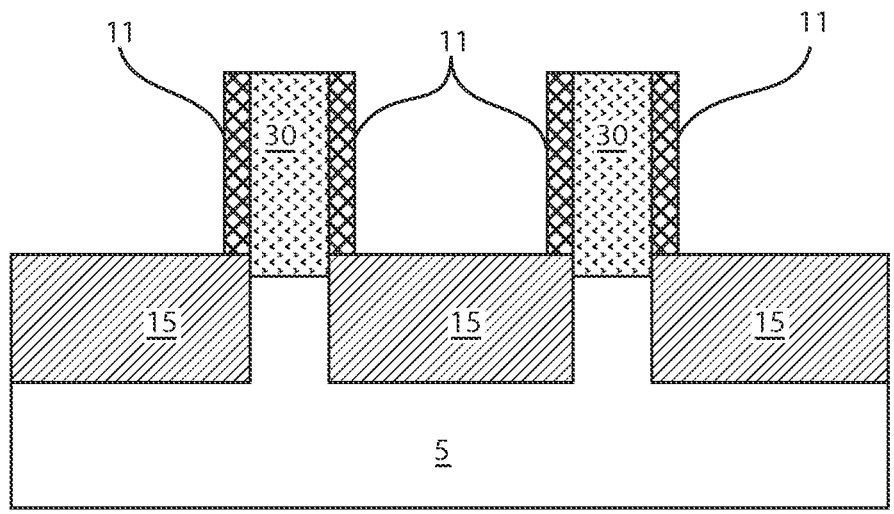
FIG. 8B is a side cross-sectional view along section line A-A of FIG. 8A.

FIGS. 8A and 8B depicting one embodiment of epitaxially forming the functional channel region 30 on an exposed surface of the semiconductor substrate 5. The functional channel region 30 is the portion of the fin structure 10' that operates to switch the semiconductor device from an "on" to "off" state, and vice versa. The functional channel region 30 is present between the source region portion of the fin structure 10' and the drain region portion of the fin structure 10'. As used herein, the term "drain region" means a doped region in semiconductor device located at the end of the functional channel region, in which carriers are flowing out of the transistor through the drain region. The term "source region" is a doped region in the semiconductor device, in which majority carriers are flowing into the channel region. By removing the sacrificial channel portion of the fin structure 10', and replacing it with an epitaxially formed functional channel region, the methods that are disclosed herein can provide a functional channel having a material that is optimal for the performance of a channel, as well as source regions and drain regions of a material and doping concentration that is optimal for the performance of the source and drain regions.

In one embodiment, the functional channel region 30 may be composed of an epitaxially grown intrinsic semiconductor material. An intrinsic semiconductor, also called an undoped semiconductor or i-type semiconductor, is a pure semiconductor without any significant dopant species present. The number of charge carriers is therefore determined by the properties of the material itself instead of the amount of impurities. In intrinsic semiconductors the number of excited electrons and the number of holes are equal: n=p. The functional channel region 30 may be composed of a material having the same composition as the source and drain region portions of the fin structure 10', or the functional channel region 30 may be composed of a material having a different composition as the source and drain region portions of the fin structure 10'. Similar to the in situ doped semiconductor material 10 described above with reference to FIG. 1, which provides the fin structures 10', the functional channel region 30 may be composed of a type IV semiconductor material, such as a silicon including material, e.g., silicon (Si), or a germanium including material, e.g., germanium (Ge). The functional channel region 30 may also be composed of a compound semiconductor material, such as a type III-V semiconductor material, e.g., gallium arsenide (GaAs). Therefore, the above description of the type IV semiconductor materials, such as silicon including and germanium including semiconductor materials, and the above description of the compound semiconductor materials, such as type III-V semiconductor materials, that have been provided for the in situ doped semiconductor material 10 that provides the fin structures 10' are suitable for the description of the material for the functional channel region 30.

The functional channel region 30 may be formed using epitaxial deposition methods that are similar to the methods for forming the in situ doped semiconductor material 10 that is described above with reference to FIG. 1 with the exception that the method for forming the functional channel region 30 does not includes a source gas for in situ doping the functional channel region 30 with a p-type or n-type dopant. Therefore, the description of epitaxial deposition for forming the material of the fin structure 10' that is described above with reference to FIG. 1 is suitable for the description of the functional channel region 30 that is depicted in FIGS. 8A and 8B. For example, the functional channel region 30 is composed of an intrinsic semiconductor material that is epitaxially grown on an exposed surface of the semiconductor substrate 5. Therefore, the epitaxial material of the functional channel region 30 has a crystal orientation and/or crystal structure that is substantially the same as the semiconductor substrate 5. For example, when the semiconductor substrate 5 is composed of a semiconductor material having a <100> crystal orientation, the functional channel region 30 will also have a <100> crystal orientation.

The epitaxial deposition process for forming the function channel region 30 of the fin structure may be a selective deposition process. For example, although the epitaxially deposited material orientates to the crystal arrangement of a semiconductor material and is deposited thereon, the epitaxial semiconductor material may not be deposited on a dielectric material, such as the dielectric spacer 11 and the isolation regions 15. In other embodiments, semiconductor material that is deposited on dielectric surfaces during the epitaxial deposition process has an amorphous crystal structure, wherein the epitaxially deposited material on semiconductor surfaces, such as the semiconductor substrate 5, have a crystalline crystal structure. In this example, the amorphous material that is formed on the dielectric surfaces may be removed selective, e.g., by selective etching, without removing the crystalline epitaxial material that is formed on the semiconductor containing surfaces, such as the semiconductor substrate 5.

Although the functional channel region 30 is typically composed of an intrinsic semiconductor material, embodiments have been contemplated, in which the functional channel region 30 may be doped using an in-situ doping process. More specifically, similar to the in situ doping process for forming the in situ doped semiconductor material 10 that is depicted in FIG. 1, the functional channel region 30 may be in situ doped with an p-type or n-type dopant, i.e., to provide an opposite conductivity type as the source and drain region portions of the fin structure 10'. The dopant concentration that provides the p-type or n-type conductivity of the functional channel region 30 of the fin structure may be uniform throughout the entirety, e.g., thickness, of the functional channel region 30.

Figure 9A:
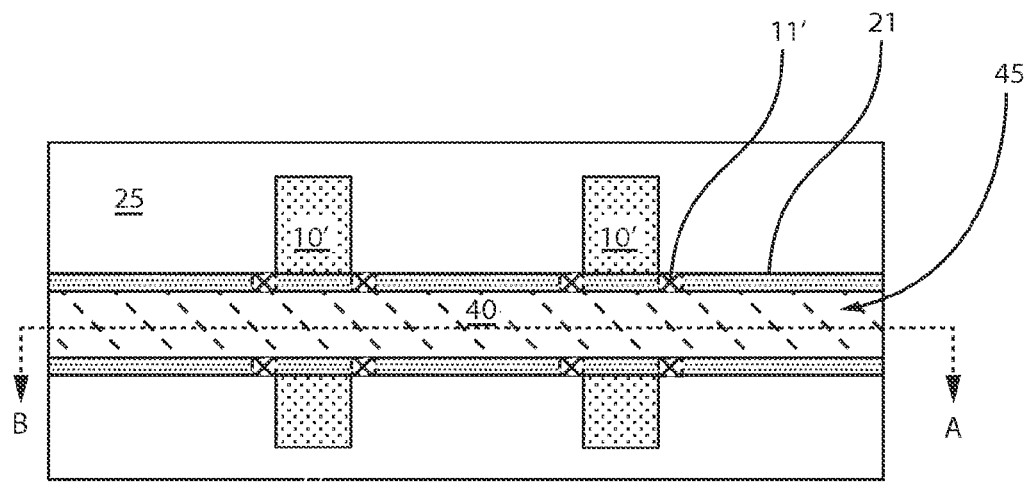
FIG. 9A is a top down view depicting forming a functional gate structure on the functional channel region of the fin structure, in accordance with one embodiment of the present disclosure.
Figure 9B:
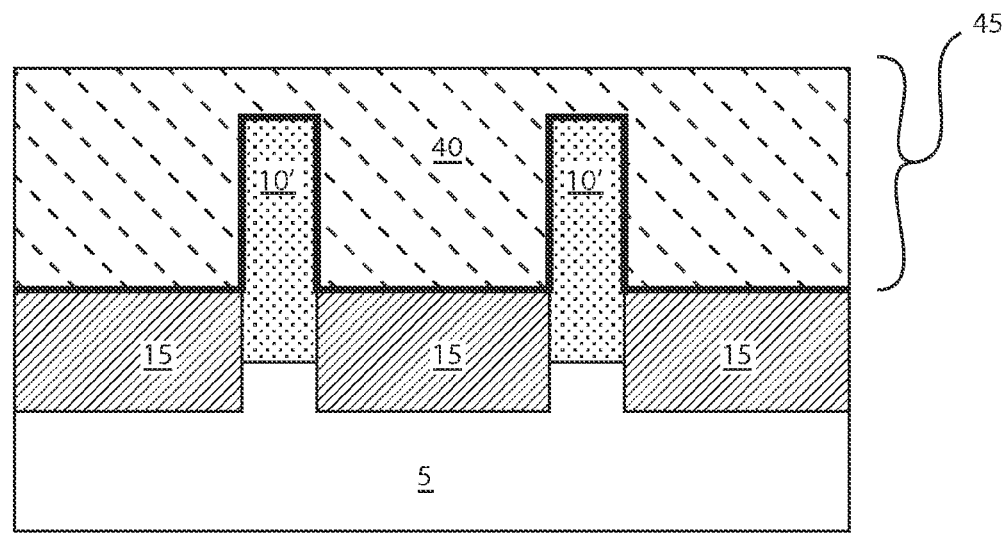
FIG. 9B is a side cross-sectional view along section line A-A of FIG. 9A.

FIGS. 9A and 9B depict one embodiment of forming a functional gate structure 45 on the functional channel region 30 of the fin structure. In some embodiments, prior to forming the functional gate structure 45, the remaining portions of the dielectric spacer 11 that are not protected by the gate sidewall spacer 21 may be removed. The exposed portions of the dielectric spacer 11 are removed using an etch process. For example, the remaining portion of the dielectric spacer 11 may be removed using an etch process that is selective to the gate sidewall spacer 21.

Following removal of the exposed portions of the dielectric spacer, a remaining portion of the dielectric spacer 11' is present underlying the gate sidewall spacer 21. In this manner, a composite spacer is provided of the remaining portion of the dielectric spacer 11' and the gate sidewall spacer 21. The remaining portion of the dielectric spacer 11' provides the base of the composite spacer, and the gate sidewall spacer 21 is present atop the remaining portion of the dielectric spacer 11'. In FIG. 9A, the remaining portion of the dielectric spacer 11' is depicted using a broken line to indicate that the remaining portion of the dielectric spacer 11' is present under the gate sidewall spacer 21. In some embodiments, the dielectric material that provides the remaining portion of the dielectric spacer 11' may be different from the dielectric material that provides the gate sidewall spacer 21. For example, the remaining portion of the dielectric spacer 11' may be composed of a nitride, e.g., silicon nitride, or oxynitride, silicon oxynitride, and the gate sidewall spacer 21 may be composed of a low-k dielectric or a nitride.

The function gate structure 45 typically includes at least one gate dielectric 35 and at least one gate conductor 40, wherein the at least one gate dielectric 35 is positioned between the at least one gate conductor 40 and the function channel portion 30 of the fin structure. The at least one gate dielectric 35 is typically positioned on at least the sidewalls and upper surface of the functional channel region 30 of the fin structure. The at least one gate dielectric 35 may be formed by a thermal growth process such as, e.g., oxidation, nitridation or oxynitridation. The at least one gate dielectric 35 may also be formed by a deposition process, such as, e.g., chemical vapor deposition (CVD), plasma enhanced CVD (PECVD), metal organic CVD (MOCVD), atomic layer deposition (ALD), evaporation, reactive sputtering, chemical solution deposition and other like deposition processes. The at least one gate dielectric 35 may also be formed utilizing any combination of the above processes.

The at least one gate dielectric 35 may be comprised of a high-k gate dielectric having a dielectric constant that is greater than the dielectric constant of silicon oxide, e.g., about 4.0 or greater. In another embodiment, the at least one gate dielectric 35 is comprised of an insulating material having a dielectric constant greater than 7.0. The dielectric constants mentioned herein are relative to a vacuum. In one embodiment, the at least one gate dielectric 35 employed in the present disclosure includes, but is not limited to, an oxide, nitride, oxynitride and/or silicates including metal silicates, aluminates, titanates and nitrides. In one example, when the at least one gate dielectric 35 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric 35 may vary, but typically, the at least one gate dielectric 35 has a thickness from 1 nm to 10 nm. In another embodiment, the at least one gate dielectric 35 has a thickness from 1 nm to 3 nm.

After forming the material layer for the at least one gate dielectric 35, a conductive material which forms the at least one gate conductor 40 of functional gate structure 45 is formed on the at least one gate dielectric 35 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The conductive material may be doped or undoped. If doped, an in-situ doping deposition process may be employed. Alternatively, a doped conductive material can be formed by deposition, ion implantation and annealing.

In another aspect of the present disclosure, a semiconductor device, e.g., FinFET, is provided that includes a fin structure comprising a function channel region 30 and source and drain region portions 10', wherein the source and drain region portions 10' of the fin structure are composed of a first epitaxial semiconductor material that is in-situ doped, and the functional channel region 30 of the fin structure is composed of a second epitaxial semiconductor material. The second epitaxial material may be an intrinsic semiconductor. A gate structure, i.e., functional gate structure 45, may be present on the functional channel region 30 of the fin structure. The source and drain region portions of the fin structure are doped with an n-type or p-type dopant using an in situ doping process. Therefore, in comparison to the source and drain region portions of fin structures that are doped using ion implantation, the source and drain region fin portions that are provided by the present disclosure have a low defect density. Further, the dopant concentration of the source and drain region portions of the fin structure that is provided by the disclosed methods and structures is uniform as a result of in situ doping. The high dopant concentration, high uniformity and low diffusion that is provided by the disclosed methods and structures provides an abrupt junction between the source and drain region portions of the fin structure, and the functional channel region 30 of the fin structure. In some embodiments, the edge of the source and drain portions of the fin structure are aligned with a sidewall of the at least one gate conductor of the overlying functional gate structure 45.

In some embodiments, the structures disclosed herein include a fin structure with uniform doping of n-type or p-type dopants in the source and drain region portions of the fin structure 10', and a lower dopant concentration of n-type or p-type dopants in the source and drain region portions of the fin structure 10' than the dopant concentration of n-type or p-type dopants in the epitaxial merge structures 25 that are formed on the source and drain region portions of the fins structure 10'. The junction of the source and drain region portions of the fin structure 10' with the intrinsic channel region portion 30 of the fin structure is abrupt. By "abrupt" junction, it is meant that the transition from a high concentration of doped semiconductor material in the source and drain regions of the device to an undoped semiconductor material in the channel region of the device is within 1 nm to 2 nm. The edge of the junction of the source and drain portions of the fin structure to the function channel region 30 is aligned with a sidewall of the gate structure 45. The high concentration of n-type or p-type dopant in the source and drain region portions of the fin structure 10' typically ranges from $1 \times 10^{14}$ atoms/cm$^{14}$ to $2 \times 10^{21}$ atoms/cm$^3$. In another embodiment, the high concentration of n-type or p-type dopant in the source and drain region portions of the fin structure 10' may range from $1 \times 10$ atoms/cm$^3$ to $1 \times 10^{21}$ atoms/cm$^3$. In yet another embodiment, the high concentration of n-type or p-type dopant in the source and drain region portions of the fin structure 10' that is present in the in situ doped semiconductor material 10 may range from $5 \times 10^{19}$ atoms/cm$^3$ to $2 \times 10^{20}$ atoms/cm$^3$. The functional channel region 30 is composed of an intrinsic semiconductor material that is free of n-type or p-type dopant. The methods and structures disclosed herein provide a very abrupt junction with doped material touching undoped material, and no diffusion tail.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming fin structures from an in-situ doped semiconductor layer that is present on a semiconductor substrate;
    forming a sacrificial gate structure on a sacrificial channel portion of the fin structures;
    forming epitaxial merge structures on the source and drain region portions of the fin structures, the source and drain region portions of the fin structures being doped by said forming the fin structures from said in-situ doped semiconductor material prior to forming the sacrificial gate structure;
    removing the sacrificial gate structure to expose the sacrificial channel portion of the fin structures;
    replacing the sacrificial channel portion of the fin structure with functional channel region; and
    forming a functional gate structure on the functional channel region.

2. The method of claim 1 further comprising forming a gate sidewall spacer on the sacrificial gate structure.

3. The method of claim 2 further comprising forming a dielectric spacer around the fin structures prior to forming the sacrificial gate structure, and removing the dielectric spacer from the source and drain region portions of the fin structure after forming the sacrificial gate structure, wherein a remaining portion of the dielectric spacer is present under the gate sidewall spacer.

4. The method of claim 1, wherein the in-situ doped semiconductor layer is epitaxially grown on the semiconductor substrate.

5. The method of claim 1, wherein said forming the fin structures comprises etching the in-situ doped semiconductor layer using sidewall image transfer (SIT).

6. The method of claim 1, further comprising forming isolation regions between adjacent fin structures before forming the sacrificial gate structure.

7. The method of claim 1, wherein the removing of the sacrificial gate structure to expose the sacrificial channel portion of the fin structures comprises an etch process that is selective to the epitaxial merge structures and the sacrificial channel portion of the fin structure.

8. The method of claim 1, wherein replacing the sacrificial channel portion of the fin structure with functional channel region comprises:
    removing the sacrificial channel portion with an etch that is selective to the semiconductor substrate and the epitaxial merge structures; and
    epitaxially forming the functional channel region on an exposed surface of the semiconductor substrate.

9. The method of claim 1, wherein the functional channel region is formed of an intrinsic semiconductor material or the functional channel region has a conductivity type that is opposite the source and drain region portions of the fin structure.

10. The method of claim 1, wherein forming the functional gate structure on the functional channel region comprises:
    depositing a gate dielectric on the functional channel region of the fin structure; and
    depositing a gate conductor on the gate dielectric.

* * * * *